(12) United States Patent
Schmitt

(10) Patent No.: US 6,186,768 B1
(45) Date of Patent: Feb. 13, 2001

(54) METAL MATRIX COMPOSITE (MMC) BODY

(75) Inventor: Theodore Nicolas Schmitt, Vienna (AT)

(73) Assignee: Electrovac, Fabrikation elektrotechnischer Spezialartikel Gesellschaft m.b.H., Klosterneuburg (AT)

( * ) Notice: Under 35 U.S.C. 154(b), the term of this patent shall be extended for 0 days.

(21) Appl. No.: 09/148,450

(22) Filed: Sep. 4, 1998

(30) Foreign Application Priority Data

Sep. 2, 1998 (AT) .................................... 1490/98

(51) Int. Cl.[7] .............................. B32B 5/32; B32B 33/00; C04B 35/565
(52) U.S. Cl. ................. 425/550; 428/551; 428/539.5; 428/613; 428/312.6; 428/319.1; 428/698; 501/88; 501/154
(58) Field of Search ................... 428/550, 551, 428/613, 539.5, 307.3, 312.6, 318.4, 319.1, 308.4, 408, 498, 701, 702; 501/88, 154

(56) References Cited

U.S. PATENT DOCUMENTS

| | | |
|---|---|---|
| 3,465,965 | 9/1969 | Schrewelius . |
| 4,761,134 * | 8/1988 | Foster . |
| 4,913,738 * | 4/1990 | Tsukada . |
| 5,002,905 * | 3/1991 | Boecker et al. . |
| 5,616,421 | 4/1997 | Sawtell et al. . |
| 5,770,324 * | 6/1998 | Holmes et al. . |

FOREIGN PATENT DOCUMENTS

| | | |
|---|---|---|
| 38 04 124 * | 8/1989 | (DE) . |
| 196 81 334 T1 | 12/1996 | (DE) . |
| 197 10 202 A1 | 10/1997 | (DE) . |
| 05 070 823 * | 3/1993 | (JP) . |
| 07 215 781 * | 8/1995 | (JP) . |
| 9 208 319 * | 8/1997 | (JP) . |

\* cited by examiner

Primary Examiner—Deborah Jones
Assistant Examiner—Jason Savage
(74) Attorney, Agent, or Firm—Henry M. Feiereisen

(57) ABSTRACT

Metal matrix composite body (MMC body) includes a porous reinforcement material (15) having pores being filled with an infiltration material (14) selected from the group metal and metal alloy, with the reinforcement material (15) being formed by recrystallized silicon carbide (RSiC).

17 Claims, 5 Drawing Sheets

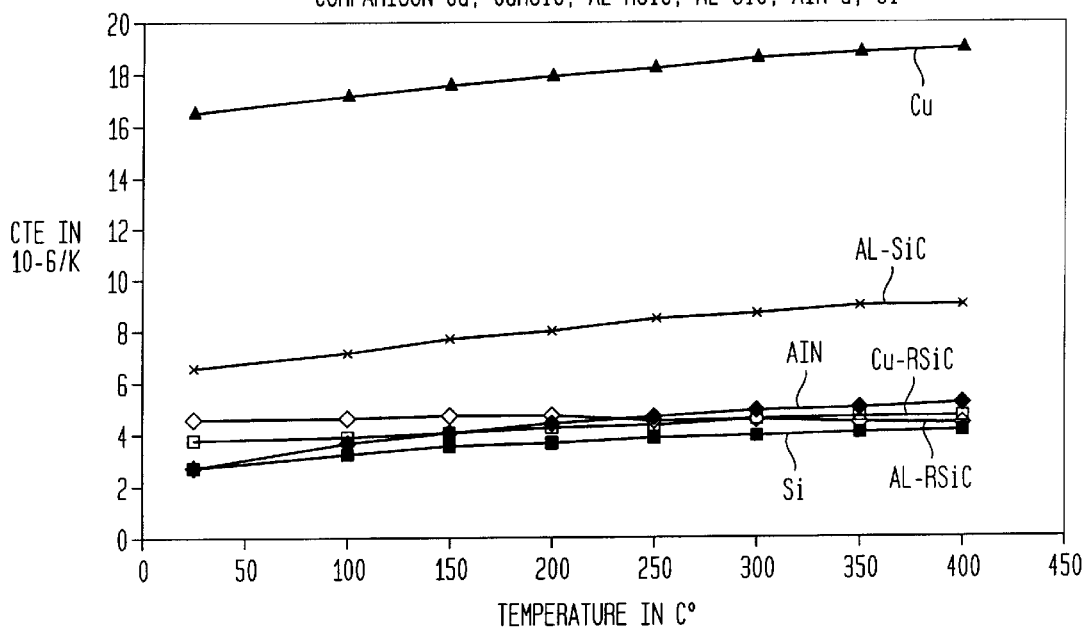

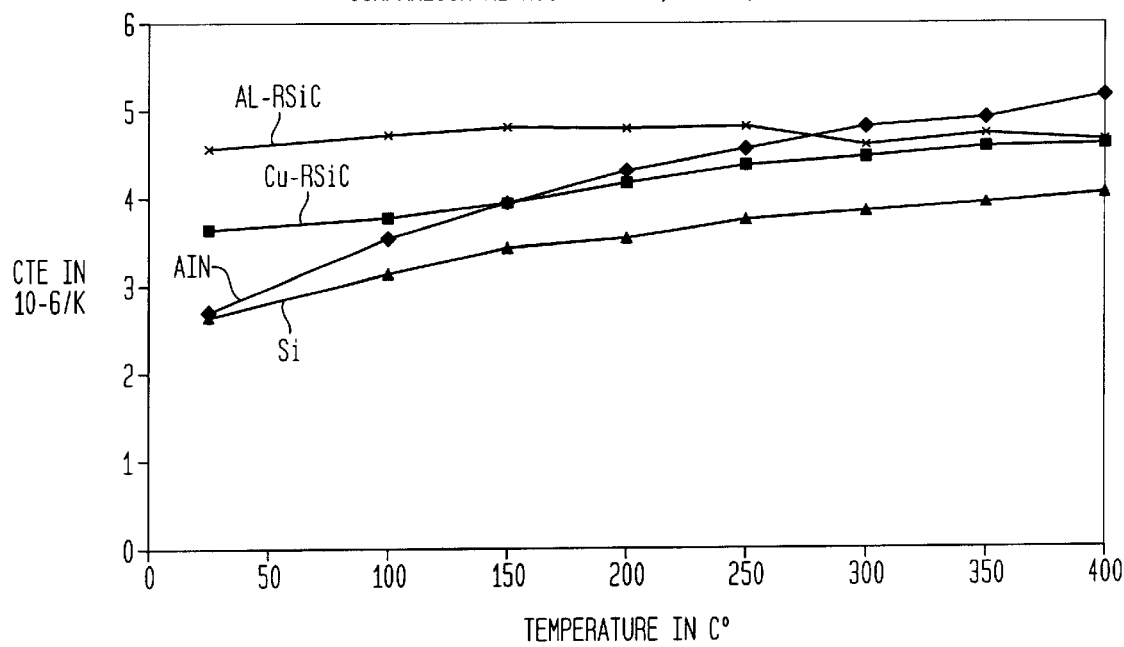

METAL MATRIX COMPOSITE (MMC) BODY

The invention refers to a metal matrix composite body (MMC body), including a porous reinforcement material having pores which are filled with an infiltration material selected from the group metal and metal alloy.

Metal matrix composites, also designated metal matrix composite materials or short MMC, are materials in which a nonmetallic reinforcement material and a metallic or semimetallic infiltration material are embedded within each other at different quantity ratios. The reinforcement material can be engulfed or infiltrated in the form of particles, fibers or porous bodies by metal or semimetal. Through selection of the type, shape, quantity and porosity of the reinforcement material as well as the type of the infiltration material, mechanical, electrical and thermal properties of finished materials can be accordingly varied to suit the demand.

A possible field of application of such MMC bodies is the electronic field or power electronics where they are utilized to dissipate lost heat generated by electronic components and thus are used to make heat sinks or circuit carriers.

For that, in particular the following three characteristics are required:
1.) High thermal conductivity—so that the lost heat generated by an electronic component can be dissipated as efficiently as possible.
2.) Low coefficient of thermal expansion, or coefficient of thermal expansion which substantially corresponds to the coefficient of thermal expansion of the component being cooled—so that the component and the attached heat sink change their dimensions in a substantially same manner when the temperature fluctuates so as to avoid tensions in the interface between component and heat sink.
3.) Low density—so that a smallest possible weight of the heat sink/circuit carrier can be realized.

A further possible field of application of MMC materials is their use for designing hot plates, with an insulator, for example of ceramic material, such as $Al_2O_3$, AlN, $Si_3N_4$, secured to the surface opposite the placement surface for a cooking pot. Attached to the surface of the insulator in opposition to the MMC plates is an electric heating resistance. Also for this field of application, the MMC plate should exhibit the above-stated three characteristics: the high thermal conductivity is required in order to efficiently transmit the heat generated by the heat conductor onto the cooking pot, the good match of the coefficients of thermal expansion between plate and insulator eliminates despite temperature fluctuations in the interface between MMC plate and insulator the formation of tensions which would result in a separation of both components from one another, and the low density realizes a low overall weight of the hot plate.

It is an object of the present invention to provide a MMC body of the above-stated type, which has all of the stated three characteristics to a high degree, but yet exhibits a particularly low coefficient of thermal expansion which especially matches the coefficient of thermal expansion of e.g. AlN and Si.

This object is attained in accordance with the invention by forming the reinforcement material from recrystallized silicon carbide (RSiC).

As a consequence of the structural configuration of this material, metal trapped in the pores can no longer deform the RSiC. The coefficient of thermal expansion of the entire MMC body is thus essentially defined solely by the coefficient of thermal expansion of the RSiC.

In accordance with a further development of the invention, it may be provided that the recrystallized silicon carbide has a porosity of 5 to 40% by volume, preferably 10 to 35% by volume, in particular 2 to 30% by volume.

By using these different porosities, the coefficient of thermal expansion can then be adjusted in a very precise manner.

Moreover, it may be provided to form the infiltration material from magnesium, zinc, iron, aluminum, copper or the like, as well as alloys of these metals. These materials can be additionally suited to the conditions and demands of the application.

In accordance with a further development of the invention, at least one structure may be secured to the MMC body. Thus, a formed body can be realized in a simple manner which exhibits areas of different mechanical, thermal and electrical properties. In this context, it may be provided to make the structure of electrically insulating material, in particular of a ceramic material such as e.g. $Al_2O_3$, AlN, or the like, or of diamond. The electronic component to be cooled can then be attached directly onto this insulating structure.

In accordance with a particularly preferred further development of the invention, the structure may be a diamond deposited from the gas phase, e.g. by a CVD process or PVD process, onto the MMC body. Diamond exhibits a particularly good thermal conductivity. Furthermore, as a result of the gas vapor deposition, a particularly intimate bond can be realized between the arising diamond structure and the MMC body. In both cases, heat applied—for example by an electronic component—onto the MMC body distant surface of the diamond structure can be transferred in a particular efficient manner to the MMC body.

Moreover, the body may be made of the infiltration material and formed in one piece with the MMC body. The MMC body and the attached component are then also in intimate connection which effects an especially good transfer of heat.

According to another further development of the invention, the structure may include a porous reinforcement material such as e.g. RSiC, SiC, ceramic, graphite or the like, having pores which are permeated by infiltration metal, and the structure may be formed in one piece with the MMC body.

Also in this case, the intimate bond between MMC structure and body is of advantage; moreover, the physical characteristics of the structure can be adjusted to suit those of the MMC structure through respective selection of its reinforcement material.

The invention will now be described in more detail with reference to the attached drawing, in which:

FIG. 6a is a graphical illustration plotting the coefficient of thermal expansion of Cu, Cu-RSiC, Al-RSiC, Al-SiC, AlN and Si in dependence on the temperature; and FIG. 6b is a graphical illustration plotting the coefficient of thermal expansion of Al-RSiC, Cu-RSiC, AlN and Si in dependence on the temperature.

Subject matter of the invention is a metal matrix composite body (MMC body), including a porous reinforcement material having pores filled with an infiltration material 14 selected from the group metal and metal alloy. Such MMC bodies are known per se, they have low weight and high mechanical strength, and therefore are utilized, for example, in aviation and aerospace engineering. Further positive characteristics include their low coefficient of thermal expansion while having at the same time a high thermal conductivity, enabling their use as heat sink, as circuit carrier, in heat exchanges or in other thermal applications, especially in hot plates.

A metal matrix composite body according to the invention is characterized by forming its reinforcement material through recrystallized silicon carbide (RSiC).

To date, it was known to use "normal" SiC as reinforcement material of MMC materials. This "normal" SiC, in the following designated only as SiC, is either in the form of single bodies, such as fibers, particles, whiskers, plates, which are engulfed by infiltration material, or in the form of a porous formed body having pores filled with the infiltration metal.

Such a porous formed body is realized by mixing SiC powder of a particular grain size with sintered additives, pressed to a molded member and sintered. Sintering can be carried out by several processes such as e.g. pressureless sintering, hot pressing, hot isostatic pressing, hot isostatic redensification or the like. In each of these sintering processes, the individual SiC particles are initially bound to one another along the grain boundaries. Subsequently, a coherent pore skeleton is formed whereby the initial SiC particles increasingly lose their identity. The result is shrinkage, i.e. the geometric dimensions of the molded member decrease, and formation of new grain boundaries. An even further progressing sintering results in a further shrinkage to thereby close at the same time pore voids existing between the SiC particles, in an increase of the density of the molded member and an almost 100% impenetrable molded member.

In contrast thereto, a formed body made of recrystallized SiC (RSiC) exhibits a completely different structural configuration as a result of the completely different sintering mechanism applied for its production:

Starting product for RSiC is again SiC powder which however has a particular grain distribution. A bimodal grain distribution has shown to be particularly suitable. The powder contains, on the one hand, grains of relatively large grain size (e.g. about 100 μm) and, on the other hand, grains of very small grain size reaching into the submicron range (grain size<1 μm). The small grains should be entrapped if possible in the gussets of the large grains. Unlike sintering of SiC, sintered additives are not used.

Figure 5A:
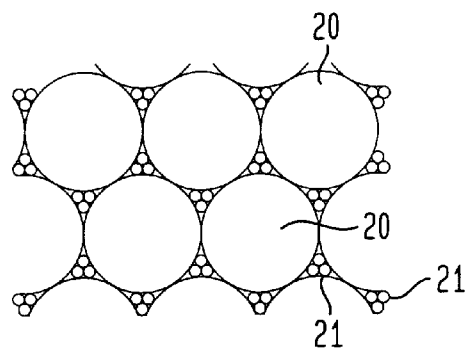
FIG. 5a is a schematic section through the starting material for making RSiC.

FIG. 5a show schematically both grain sizes, with reference numeral 20 denoting the large grains and reference numeral 21 denoting the small grains trapped in the interstices of the large grains 20. This bimodal grain distribution is important for the sintering process which leads to RSiC and is carried out at temperatures of above 2200° C. inside an inert gas atmosphere and in which—unlike the sintering of SiC—no shrinkage processes can be observed.

The absence of shrinkage can be explained by the evaporation of the particles of the fine grain fraction during the sintering process as a result of their high surface energy, and their subsequent condensation from the gas phase at the contact sites of the coarse particles. The fine grain fraction cannot be traced as such any longer in the finished sintered body. Through condensation, the coarse particles grow onto one another so that common grain boundaries can be formed and a consolidation is realized. However, this grain growth is not a new formation of crystals so that the term "recrystallized SiC", introduced for a long time, actually incorrectly describes the sintering process. The grain growth results in an entanglement of the SiC crystals so that the individual crystals have a firm SiC self-binding.

Figure 5B:
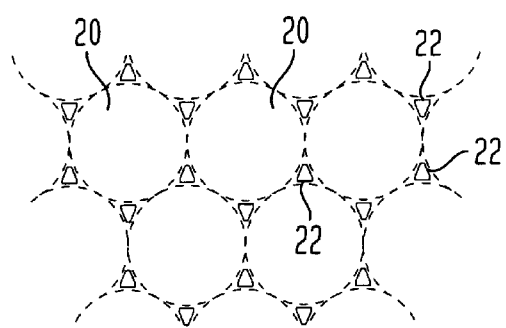
FIG. 5b is a schematic section through a finished RSiC.

A segment of a RSiC body formed in this manner is shown in FIG. 5b, with the dark areas 22 between the coarse grains 20 representing pores.

The recrystallized silicon carbide (RSiC) used in accordance with the invention as reinforcement material of a MMC body has a porosity of 5 to 40% by volume, whereby ranges from 10 to 35% by volume and in particular 20 to 30% by volume have shown in particular suitable.

Although it also possible to produce SiC with these porosity values; However there is a very significant difference between SiC and RSiC as used in accordance with the invention as far as the quality of this porosity is concerned.

As stated above, the sintering process of SiC results in a shrinkage which effects the single SiC particles to be pushed together and thus a narrowing of pores between the SiC particles. Pores in SiC are thus relatively narrow so that filling with infiltration metal becomes relatively cumbersome. The narrowing of the pores may actually also result in a closing of the pores, i.e. become inaccessible from outside. As a result of their inaccessibility, such closed pores cannot be filled with infiltration metal; they represent in the finished MMC body material defects which only deteriorate the strength of this body.

The RSiC used in accordance with the invention as reinforcement material is produced—as stated above—free of shrinkage by a sintering process so that a narrowing of pores between the large SiC particles does not occur. RSiC thus exhibits far greater pores than SiC so that filling of these pores with infiltration metal is much less cumbersome.

Moreover, the pores in RSiC cannot be closed under any circumstances, RSiC exhibits therefore an open porosity (as called channel porosity). In view of this open porosity, all pores can be filled with infiltration metal, no unfilled pores, constituting material defects, remain in the MMC body.

The shrinkage which is encountered in sintered SiC and may range depending on the intensity of the sintering process up to 40% (depending on structural part), and the associated change of the geometric dimensions of the SiC molded member has in particular the additional drawback that SiC bodies cannot be made with great dimensional precision. Moreover, shrinkage does not occur evenly (different geometry) even when the sintering parameters are the same (same temperature, same speed of temperature increase and temperature decrease, same sintering period) so that a reproducible series production of SiC bodies is only difficult to realize.

Such a shrinkage does not occur in RSiC so that the associated drawbacks are not experienced.

Application of such MMC bodies is particularly of interest in the field of electronics and power electronics. An increasing sophistication of the components in the power electronics results in ever increasing switching performance so that the need to carry away heat due to energy loss increases. In order to ensure a sufficiently rapid and efficient dissipation of this lost heat, electronic components must be mounted on circuit carriers that are made of increasingly better heat conducting materials.

Figure 1:
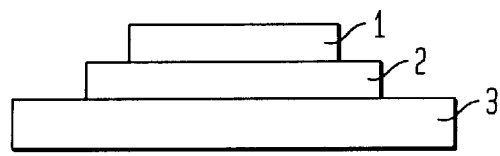
FIG. 1 is an elevational view of an electronic component arranged on a circuit carrier 3.

A schematic illustration of such a configuration is shown in FIG. 1. The electronic component 1 is a silicon chip which is mounted onto a structure 2 of electrically insulating ceramic material. This ceramic structure 2 is connected to the circuit carrier 3. FIG. 4c further shows the provision of a cooling structure which is cast onto the circuit carrier 3.

Apart from a good heat dissipation, the circuit carrier 3 must exhibit a coefficient of thermal expansion which is substantially equal, or ideally equal to the one of the component to be cooled, or to the expansion coefficient of the remaining components (ceramic structure 2) connected with the circuit carrier 3. In the event this requirement is not met, and thus the circuit carrier 3 and electronic component 1 exhibit widely different expansion coefficients, tensions are generated in the structure at temperature fluctuations, resulting in a separation of the connection between body 1 and circuit carrier 3 and eventually lead to a thermal overload of the component 1.

Application of MMC bodies is further of interest in conjunction with the manufacture of hot plates. In analogous manner to the above-described circuit carrier 3, an insulator, preferably again a ceramic like $Al_2O_3$, AlN, $Si_3N_4$, is placed on a MMC plate forming the cooking area and supporting a heat conductor. Also in this case, the coefficient of thermal expansion of the MMC plate should match as far as possible the coefficient of thermal expansion of the insulator in order to prevent temperature-based structural tensions.

Heretofore, the ceramic structure 2 is formed mainly by aluminum oxide. As this ceramic exhibits a relatively low thermal conductivity so that the heat generated by the electronic component 1 can be carried away only in a very inefficient manner, the use of aluminum nitride as insulating material is preferred. The most important physical data are listed in table 1.

TABLE 1

Physical Data of some Ceramics and Diamond

| Material | Density in g/cm$^3$ | Thermal Conductivity W/mK | Thermal Expansion coefficient in 10$^{-6}$/K |
|---|---|---|---|
| $Al_2O_3$ | 3.8 | 20–30 | 6.7–6.8 |
| AlN | 3.26 | 170–180 | 3.7 |
| Diamond | 3.52 | 800–1200 | 0.8–1.5 |
| BeO | 3 | 200 | 6.5 |

Beryllium oxide is used only for special applications for toxic reasons.

Since the AlN-ceramics have a substantially lower expansion coefficient than the $Al_2O_3$ ceramics used to date, and the switching cycles of the components 1 increasingly get shorter (and thus faster and more frequent temperature fluctuations take place), the combination with the metal copper used in circuit carriers 3 heretofore are not possible anymore:

The expansion coefficient of copper is approximately $17 \times 10^{-6}$/K, while the one of AlN is only approximately $3.7 \times 10^{-6}$/K, resulting in inadmissibly high expansion variations. This difference of the expansion coefficients can be seen in particular clearly from FIG. 6, illustrating i.a. the coefficients of thermal expansions (=Coefficients of Thermal Expansion, CTE) of copper and AlN in dependence on the ambient temperature.

Thus, copper used heretofore should be substituted by a different material which has a similarly low thermal expansion as the insulation ceramic AlN and the body material Si, at the same time has a high thermal conductivity for purposes of an efficient dissipation of lost heat generated by the component 1, and a low density for purposes of realizing a lower overall weight. Metals or their alloys have optimum values only for one or two of these parameters (high thermal conductivity, low thermal expansion and low density). The following table 2 shows respective comparisons: Copper, for example, has a very high thermal conductivity but also a high thermal expansion and a high density. Although molybdenum has a relatively high thermal conductivity and a very low expansion, it has however also a high density.

TABLE 2

Compilation of Data of Some Metals and Metal Composites

| Material | Density in g/cm$^3$ | Thermal Conductivity W/mK | Thermal Expansion coefficient in 10$^{-6}$/K |
|---|---|---|---|
| Cu | 8.96 | 390 | 17.0 |
| Al | 2.70 | 170–220 | 23 |
| AlSi12 | 2.65 | 120–190 | 20 |
| Mo | 10.20 | 146 | 5.0 |
| W | 19.3 | 160 | 4.5 |
| Steel (4140) | 7.80 | 50 | 13.5 |
| Kovar | 8.36 | 17 | 5.3 |
| Cu10W90 | 16.40 | 200 | 6.5 |
| Al-SiC | 3.0 | 180–200 | 6.5–7.5 |

A conventional material which fairly well meets the above three demands is a metal matrix composite (MMC) which the subject matter of the invention is based upon.

As shown by the last line of table 2 as well as in FIG. 6, a MMC body having a reinforcement material formed by SiC and an infiltration metal formed by Al (such a material is designated as Al-SiC), has a coefficient of thermal expansion which is clearly closer to the one of AlN and Si. Also the thermal conductivity as well as the density exhibit satisfactory results.

However, there is still a significant difference between the coefficient of thermal expansion of Al-SiC and AlN and Si, as a result of which tensions are encountered in the connections between the silicon body 1, the AlN insulation layer 2 and the circuit carrier 3 formed of Al-SiC in an arrangement according to FIG. 1 during temperature fluctuations.

When, however, forming a MMC body in a manner according to the invention with a reinforcement material from recrystallized silicon carbide (RSiC), this body exhibits a coefficient of thermal expansion which is even closer to the one of AlN and Si, cf. FIG. 6a illustrating the coefficients of thermal expansion for RSiC infiltrated with Al and Cu. When forming the circuit carrier 3 in a manner according to the invention by a MMC body reinforced with RSiC, the structure according to FIG. 1 has significantly less tensions at temperature fluctuations, resulting in an extended service life and higher reliability.

As already shown in FIG. 6a, and even clearer in FIG. 6b, Al-RSiC and Cu-RSiC have a similar low coefficient of thermal expansion. Despite different infiltration metal, these almost same coefficients of thermal expansion can be explained as follows:

As already stated above in the context of discussing the method of manufacture of RSiC, the individual SiC-particles are connected to one another by means of firm SiC self-bindings. As a result of the RSiC structural configuration, a porous RSiC body has such a high strength as to be solely determinative for the coefficient of thermal expansion of the entire MMC body. Infiltration metal entrapped in the pores of the RSiC body is incapable to deform the RSiC body by means of volumetric changes as carried out by the metal during temperature fluctuations. Therefore, even when using other infiltration metals, such as e.g. magnesium, zinc, iron, chromium or the like, or when using infiltration alloys such as e.g. AlSi7Mg, a similar low coefficient of thermal expansion of the arising MMC body is always realized.

It could be further assumed that the infiltration metal slightly pours out from the RSiC framework as a result of a volumetric increase during temperature increase—because, as discussed above, the infiltration metal cannot deform. Surprisingly, this does not happen, the RSiC body retains the infiltration metal within its pores even at temperature increase, and the expansion coefficient remains practically constant.

The effect that the reinforcement material is almost solely determinative for the coefficient of thermal expansion cannot be observed in connection with SiC used to date: if SiC was present in the form of powder or fibers, this SiC could not provide any resistance to resist the expansions of the infiltration metal because individual particles of SiC were not be linked to one another. The connection of individual particles through sintering results in a porous sintered SiC formed body which is not nearly as a compact as RSiC so that the infiltration metal trapped in the pores of the SiC conjointly moves the SiC during temperature-based volumetric changes. The coefficient of thermal expansion of conventional SiC-reinforced MMC bodies is thus heavily determined by the used infiltration metal.

The coefficient of thermal expansion of conventional MMC bodies reinforced by means of SiC formed body can be reduced by increasingly sintering the SiC formed body before the infiltration. A stronger sintering however results, on the one hand, in the problem already discussed above, namely that the pores of the SiC become narrower—and thus make it more complicated to be filled with infiltration material—or that the pores are closed, i.e. no longer accessible from outside and thus incapable of being filled with infiltration material at all.

On the other hand, a stronger sintering of SiC formed bodies will not lead to expansion coefficients which are as low as can be realized with the use of RSiC according to the invention. In addition, also the thermal conductivity decreases since less metal can be filled in the SiC formed body.

The infiltration material 14 determines the parameters thermal conductivity and density in a MMC body reinforced with RSiC so that both these parameters are adjustable through respective selection of infiltration material 14. The actually used infiltration material 14 can be selected randomly or in dependence on the application, for example, magnesium, zinc, iron or the like can be used, whereby the metals aluminum and copper as well as their alloys such as e.g. AlSi7Mg, in particular upon use of the MMC body according to the invention as heat sink or heat dissipating circuit carrier are preferred.

A MMC body according to the invention is made by any one of conventional infiltration processes, for example by a die casting process, squeeze casting, gas pressure infiltration or pressureless or spontaneous infiltration. Common to all these processes is the initial liquefaction of the infiltration material 14 by heating and its subsequent forcing into the pores of the reinforcement material by applying a piston pressure (=squeeze casting) or gas pressure onto the liquid infiltration material 14 or by spontaneous action because the infiltration material 14 is brought into contact with materials which so reduce the surface tension of the infiltration metal that the infiltration metal seeps into the pores of the reinforcement material (spontaneous infiltration).

Figure 2:
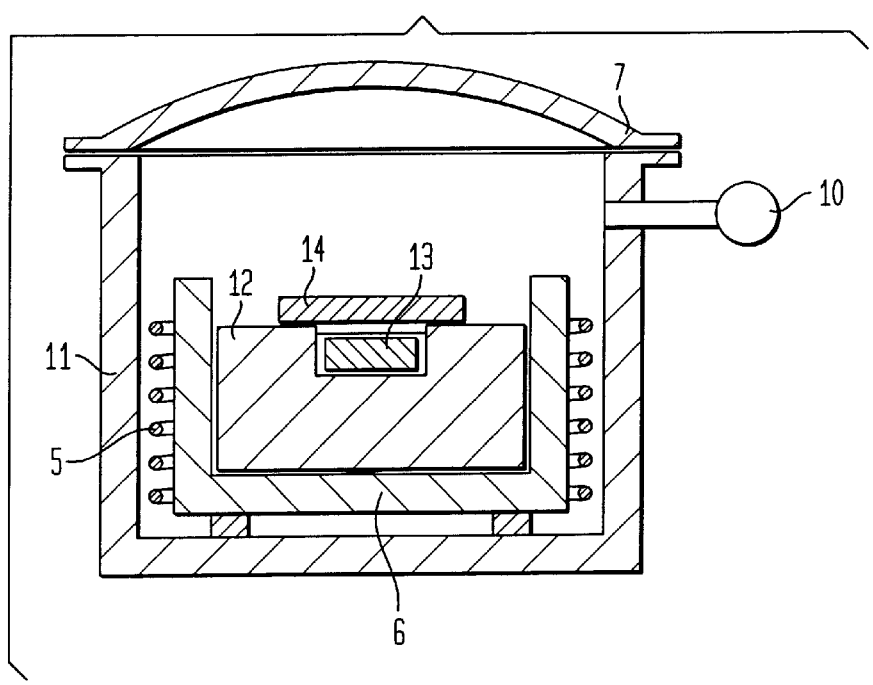
FIG. 2 is an elevational, partially sectional, view of an apparatus for making a MMC body according to the invention by means of a gas pressure infiltration process.

With reference to FIG. 2, the preferred gas pressure infiltration process is being described as an example in more detail. Reference numeral 11 denotes the complete apparatus used for making a MMC body according to the invention. Located within the apparatus 11 is a preform holder 12 for receiving the preform 13. The preform 13 is comprised of the reinforcement material arranged in a desired fashion and made of RSiC. The entire arrangement is loaded into a crucible 6. The apparatus 11 is closeable by a cover 7 so as to allow application of pressure from a pressure source 10 upon the apparatus. Placed on the edges of the preform holder 2 is a block or feeder of infiltration material 14 to be melted on. Under the influence of the heater 5, the infiltration material 14 is melted and forced under pressure into the preform 13; Thereafter, the heater 5 is turned off and the infiltration material 14 is left to solidify under pressure. Before melting of the infiltration material 14, the apparatus 11 can be evacuated to thereby remove air trapped within the pores of the preform 13.

According to a further variation of this production process, the heater 5 can be omitted, with the infiltration material 14 being melted outside the apparatus 11 and applied in molten phase upon the preform 13.

A MMC body according to the invention can be utilized in all suitable fields of application, where components of high strength and/or high thermal conductivity and/or low thermal expansion at simultaneous low weight are required. Its geometric shape and the type of its infiltration material 14 can be selected in accordance with the demands for each application.

In particular preferred is the use of the MMC body according to the invention in electric or electronic components. FIG. 1 has already been referred to above and shows this field of application. And electronic component 1 is shown there in the form of a silicon chip which is placed upon a circuit carrier 3 via a structure 2 made of insulating ceramic material. This circuit carrier 3 is formed by a MMC body according to the invention.

The structure 2 is secured to the MMC body by conventional joining processes such as e.g. gluing, soldering or the like, but could also be cast with the MMC body. Casting results in a particularly intimate connection when placing the structure 2, during introduction of the infiltration material 14 into the reinforcement material 15, together with the reinforcement material 15 into the casting mold which is used for carrying out the infiltration process and designated above as preform holder 12 in conjunction with the discussion of FIG. 2.

Figure 3:
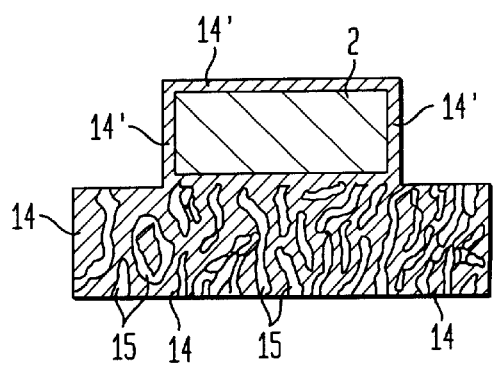
FIG. 3 is a vertical section through a MMC body according to the invention with attached structure 2.

FIG. 3 shows a section through such a MMC structure onto which a structure 2 is cast. The sections 14' of the infiltration material 14, shown by dashed lines and surrounding the body 2, need not be present, they may be removed after making the MMC body, or the structure 2 may be covered in these areas so that these dashed sections 14' of the infiltration material 14 cannot develop at all. In particular when using the MMC body according to FIG. 1, this removal or omission of the sections 14' is necessary to realize an electric insulation of the electronic assembly 1 from the circuit carrier 3.

FIG. 3 further schematically shows how infiltration material 14 and reinforcement material 15 are embedded within each another.

A further possible field of application of a MMC body according to the invention is the manufacture of hot plates e.g. for household stoves. In this case, the MMC body according to the invention forms the plate for placement of a cooking pot, and has an insulator which is arranged on the surface opposing this placement surface and having arranged thereon an electric heat conductor. Such a hot plate is therefore a MMC body with attached structure 2, as illustrated in FIG. 3.

The structure 2 attached to the MMC body may be made basically from any material such as e.g. metal, semimetal or the like; However it must be electrically insulated for the application shown in FIG. 1 and for the just discussed use as a hot plate, whereby, as stated above, the structure 2 is formed preferably by a ceramic. Examples for concrete materials includes $Al_2O_3$, AlN or the like.

For the preferred field of application illustrated in FIG. 1, the combination of a MMC body having infiltration material 14 made of aluminum or an aluminum alloy, such as e.g. AlSi7Mg, with a structure 2 of AlN is especially suitable because both these materials exhibit a similar low expansion coefficient, a similar high thermal conductivity and a low specific weight.

Of particular interest in this context is the formation of the structure 2 from diamond. As shown in table 1, this material has a particularly high thermal conductivity and a coefficient of thermal expansion which especially resembles the one of RSiC infiltrated with aluminum. Attachment of a structure 2 made of diamond upon the MMC body can also be realized through gluing, casting or the like, whereby it has been shown particularly suitable to produce the diamond-based structure 2 through deposition from the gas phase, with the diamond being deposited directly upon the MMC body.

This deposition is realized by processes known per se, for example CVD-process like hot filament CVD or plasma CVD like e.g. microwave CVD, plasma jet or the like or PVD processes.

Figure 4A:
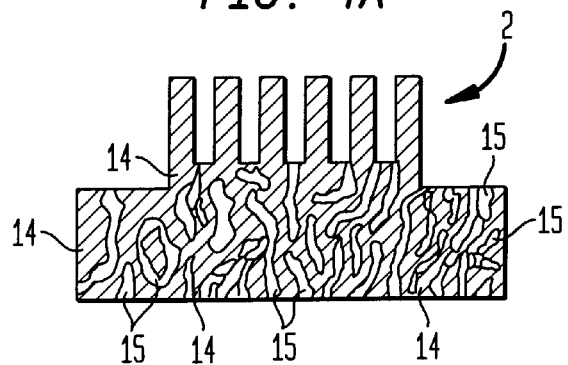
FIG. 4a shows the MMC structure in same illustration as in FIG. 3 with a differently configured body 2 cast onto the MMC body 3.

Two further possibilities of designing the structure 2 attached to the MMC body are shown in FIGS. 4a, b. In FIG. 4a, the structure 2 is made of the infiltration material 14 itself and is formed in one piece with the MMC body. The structure 2 thus represents a sprue upon the MMC body and is formed simultaneously with the production of the MMC body: For that a casting mold or perform holder 12 is used which has for the reinforcement material 15 a receiving space which includes an adjoining depression, with the depression corresponding to the shape of the structure 2 to be cast. When being introduced into the casting mold or the preform holder 12, the liquid infiltration material 14 permeates the reinforcement material 15, on the one hand, and fills the depression for the structure 2 to be cast, on the other hand.

The geometric shape of this cast structure 2 is randomly selectable as is the shape of the structures 2 made from other materials. As shown in FIG. 4a, this structure could be formed, for example, with cooling ribs.

Figure 4B:
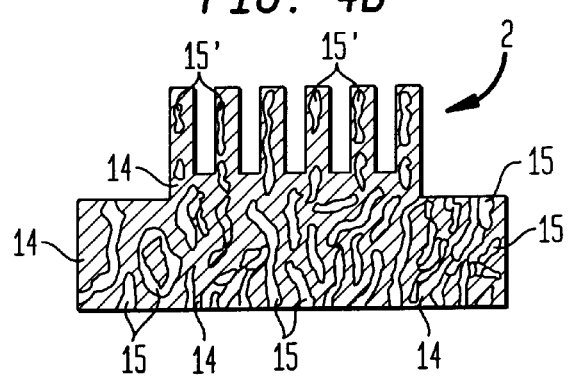
FIG. 4b shows the MMC body in same illustration as in FIG. 4b, with the structure 2 containing reinforcement material 15'.
Figure 4C:
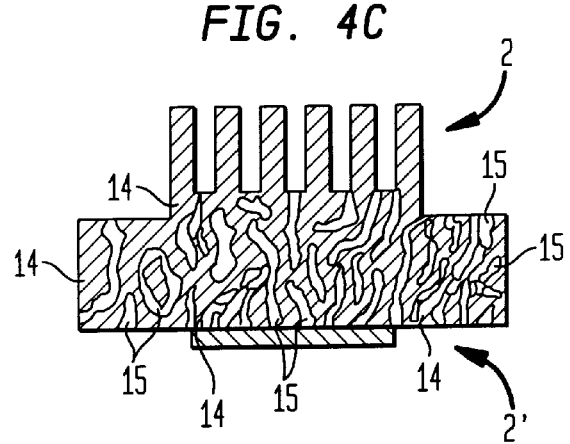
FIG. 4c shows the MMC body in same illustration as in FIG. 4a, with a further body 2' being attached to the MMC body.

The structure 2 illustrated in FIG. 4b also constitutes as the one according to FIG. 4a a sprue on the MMC body; However, the structure 2 contains—as the MMC body itself—porous reinforcement material 15' having pores which are permeated by the infiltration material 14. The manufacture of a MMC body with such a structure 2 again is realized by a casting mold which includes a depression in the shape of the structure 2 in addition to the receiving space for the reinforcement material 15. Received in this depression is however reinforcement material 15', such as e.g. RSiC, fibers of ceramic or graphite; particles like SiC, AlN $Al_2O_3$ or the like, which reinforcement material 15' is engulfed and permeated by the infiltration material 14.

Instead of individual structures 2 as being illustrated so far, it is also possible to attach several structures 2 upon the MMC body whereby these plurality of structures 2 may be made of same or different materials. In this context, it is possible, as shown for example in FIG. 4c, to place on one surface of the MMC body a first structure 2 formed as sprue and having the configuration of a heat sink, and to place on another surface of the MMC body a second structure 2' made of insulating material for attachment of an electronic component to be cooled.

Figure 4D:
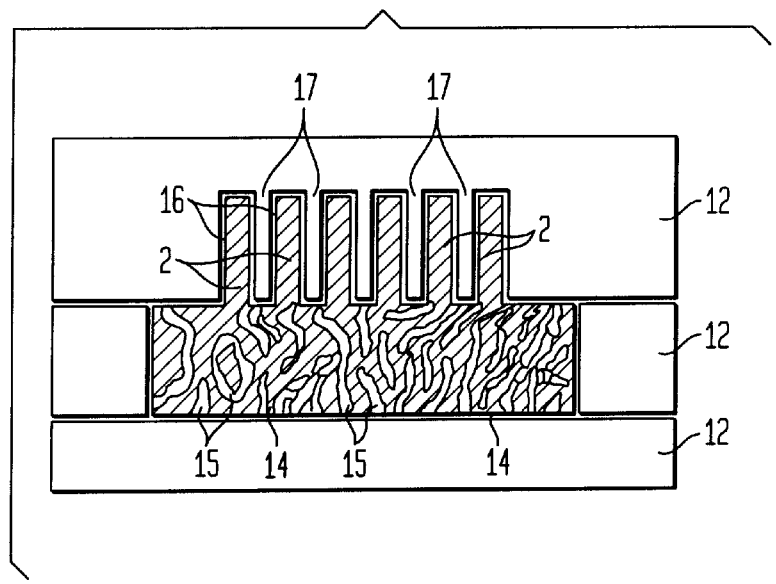
FIG. 4d is a vertical section of a MMC body according to the invention still positioned in the preform holder 12 and having attached thereon several bodies 2.

Furthermore, it is possible to provide several bodies 2 for attachment on the MMC body to form sprues, respectively made of infiltration material 14 on the MMC body. FIG. 4d shows a section through such a MMC body still positioned in the multipart preform holder 12, with the bodies 2 being shown as parallelepiped cooling fins or cylindrical cooling knobs. Also shown here are the above mentioned depressions 16 in the preform holder 12 within which the bodies 2 are cast on. The preform holder 12 is formed between the depressions 16 with webs 17. During cooling, following conclusion of the infiltration process, the structure 2 as well as the MMC body contract so that the distance between the structures 2 decreases.

In conventionally used SiC, the MMC body exhibits a relatively great coefficient of thermal expansion with the result that the MMC body shrinks to such an extent during cooling within the preform holder 12 that the webs 17 are squeezed by both neighboring bodies 2. The MMC body thus shrinks onto the preform holder 12 and can no longer be removed, or removal is very cumbersome.

In contrast thereto, a MMC body reinforced in a manner according to the invention with RSiC shrinks to a significantly less extent, so that the just discussed "shrinking on" of the structure onto the preform holder 12 cannot occur and easy removal is always possible.

Although the attachment of at least one structure 2 on the MMC body has been illustrated only in conjunction with the use of the MMC body as circuit carrier or heat sink, it is still possible to provide such a structure 2 also in other applications of the MMC body according to the invention.

What is claimed is:

1. A metal matrix composite body (MMC body) for transferring heat, including a porous reinforcement material having pores being filled with an infiltration material selected from the group consisting of magnesium, zinc, iron, aluminum, copper and alloys thereof, said reinforcement material being formed by recrystallized silicon carbide (RSiC); and at least one structure attached to the MMC body and made of electrically insulating material, said structure being a diamond deposited on the MMC body from the gas phase.

2. The MMC body according to claim 1, wherein the recrystallized silicon carbide has a porosity of 5 to 40% by volume.

3. The MMC body according to claim 1, wherein the infiltration material forms the structure, with the structure formed in one piece with the MMC body.

4. The MMC body according to claim 1, wherein the recrystallized silicon carbide has a porosity of 10 to 35% by volume.

5. The MMC body according to claim 1, wherein the recrystallized silicon carbide has a porosity of 20 to 30% by volume.

6. The MMC body according to claim 1, wherein the diamond is deposited on the MMC body from the gas phase by a process selected from the group consisting of CVD process and PVD process.

7. A metal matrix composite body (MMC body) for transferring heat, including a porous reinforcement material having pores being filled with an infiltration material selected from the group consisting of magnesium, zinc, iron, aluminum, copper and alloys thereof, said reinforcement material being formed by recrystallized silicon carbide (RSiC); and at least one structure attached to the MMC body, wherein the structure comprises a porous reinforcement material having pores permeated by the infiltration material, said structure being formed in one piece with the MMC body.

8. The MMC body according to claim 7, wherein the structure is made of ceramic.

9. The MMC body according to claim 8, wherein the ceramic is a material selected from the group consisting of $Al_2O_3$ and AlN.

10. The MMC body according to claim 7, wherein the porous reinforcement material for the structure is selected from the group consisting of RSiC, SiC, ceramic and graphite.

11. The MMC body according to claim 7, wherein the recrystallized silicon carbide has a porosity of 5 to 40% by volume.

12. The MMC body according to claim 7, wherein the recrystallized silicon carbide has a porosity of 10 to 35% by volume.

13. The MMC body according to claim 7, wherein the recrystallized silicon carbide has a porosity of 20 to 30% by volume.

14. A metal matrix composite body (MMC body) for transforming heat, including a porous reinforcement material having pores being filled with an infiltration material selected from the group consisting of magnesium, zinc, iron, aluminum, copper and alloys thereof, said reinforcement material being formed by recrystallized silicon carbide (RSiC); and at least one structure attached to the MMC body and made of electrically insulating material, wherein the electrically insulating material is a diamond.

15. The MMC body according to claim 14, wherein the recrystallized silicon carbide has a porosity of 5 to 40% by volume.

16. The MMC body according to claim 14, wherein the recrystallized silicon carbide has a porosity of 10 to 35% by volume.

17. The MMC body according to claim 14, wherein the recrystallized silicon carbide has a porosity of 20 to 30% by volume.

* * * * *